United States Patent
Nakazawa

(10) Patent No.: US 8,426,291 B2
(45) Date of Patent: Apr. 23, 2013

(54) METHOD FOR ISOLATION FORMATION IN MANUFACTURING SEMICONDUCTOR DEVICE

(75) Inventor: Toru Nakazawa, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/307,759

(22) Filed: Nov. 30, 2011

(65) Prior Publication Data

US 2012/0149170 A1  Jun. 14, 2012

(30) Foreign Application Priority Data

Dec. 14, 2010  (JP) .................. 2010-278395

(51) Int. Cl.
*H01L 21/76* (2006.01)

(52) U.S. Cl.
USPC ........... 438/424; 438/400; 438/404; 438/413; 257/E21.546

(58) Field of Classification Search ........... 438/400, 438/404, 413, 424; 257/E21.546
See application file for complete search history.

(56) References Cited

U.S. PATENT DOCUMENTS

| 6,333,519 B1 | 12/2001 | Nakazawa |
| 6,411,349 B2 | 6/2002 | Nakazawa et al. |

FOREIGN PATENT DOCUMENTS

| JP | 3-187224 A | 8/1991 |
| JP | 4-014836 A | 1/1992 |
| JP | 7-7008 A | 1/1995 |
| JP | 2010-040638 A | 2/2010 |

*Primary Examiner* — Thanh V Pham
(74) *Attorney, Agent, or Firm* — Fitzpatrick, Cella, Harper & Scinto

(57) ABSTRACT

A method includes forming first insulating films on first and second faces of a substrate, removing the first insulating film on the second face, forming polysilicon films on the first insulating film on the first face and the second face, forming second insulating films on the polysilicon films on the first face and the second face, etching the second insulating film on the first face using a mask including an opening, removing the second insulating films on the first face and the second face, removing the polysilicon film on the side of the first face and forming a passivation film which protects the polysilicon film on the side of the second face so that the polysilicon film on the side of the second face is not removed in the polysilicon film removing step, after the polysilicon film forming step and before the polysilicon film removing step.

7 Claims, 8 Drawing Sheets

METHOD FOR ISOLATION FORMATION IN MANUFACTURING SEMICONDUCTOR DEVICE

BACKGROUND OF THE INVENTION

1. Field of the Invention

The present invention relates to a method for manufacturing a semiconductor device.

2. Description of the Related Art

In the process of manufacturing a semiconductor device, a metal impurity such as Fe (iron) or Ni (nickel) often mixes in a silicon substrate on which the semiconductor device is to be formed. If a metal impurity, especially a heavy metal impurity, is electrically activated in the silicon substrate, this considerably degrades the property of the semiconductor device.

Paragraphs 0017-0020 of Japanese Patent Laid-Open No. 7-7008 disclose a method for forming silicon oxide films 2 on the two faces of a substrate 1, removing the silicon oxide film 2 on the back face of the substrate 1 by etching, and forming silicon nitride films 3 and 60 on the front and back faces, respectively, of the substrate 1. The silicon nitride film 60 directly formed on the back face of the substrate 1 functions as a film for gettering in which a metal impurity is removed. Paragraphs 0021-0024 of Japanese Patent Laid-Open No. 7-7008 disclose a method for removing the silicon oxide film 2 formed on the back face of the substrate 1, and forming polysilicon films 50 and 55 on the front and back faces, respectively, of the substrate 1. The polysilicon film 55 directly formed on the back face of the substrate 1 functions as a film for gettering in which a metal impurity is removed. The above-mentioned two methods disclosed in Japanese Patent Laid-Open No. 7-7008 employ a technique for forming a gettering film on the back face of the substrate during a semiconductor device manufacturing step (by the so-called inline process) to getter a heavy metal impurity without adding a complicated step (paragraphs 0020 & 0024).

When isolation such as STI (Shallow Trench Isolation) is formed in accordance with the manufacturing method disclosed in Japanese Patent Laid-Open No. 7-7008, the polysilicon film formed on the back face of the substrate as a gettering film may immediately be removed. When the polysilicon film formed on the back face of the substrate as a gettering film is immediately removed, a sufficient gettering effect cannot be obtained.

SUMMARY OF THE INVENTION

The present invention provides a technique advantageous in improving the gettering effect.

The first aspect of the present invention provides a method for manufacturing a semiconductor device, the method comprising: a first insulating film forming step of forming first insulating films on a first face and a second face of a semiconductor substrate; a first insulating film removing step of removing the first insulating film on a side of the second face; a polysilicon film forming step of forming polysilicon films on the first insulating film on a side of the first face, and the second face of the semiconductor substrate; a second insulating film forming step of forming second insulating films on the polysilicon films on the side of the first face and the side of the second face; an isolation forming step of forming isolation, the isolation forming step including a process of etching the second insulating film on the side of the first face using a mask including an opening, wherein the isolation is defined by the opening and is formed in the first face of the semiconductor substrate; a second insulating film removing step of removing the second insulating films on the side of the first face and the side of the second face after the isolation forming step; a polysilicon film removing step of removing the polysilicon film on the side of the first face, of the first face and the second face; and a passivation film forming step of forming a passivation film which protects the polysilicon film on the side of the second face so that the polysilicon film on the side of the second face is not removed in the polysilicon film removing step, after the polysilicon film forming step and before the polysilicon film removing step.

The second aspect of the present invention provides a method for manufacturing a semiconductor device, the method comprising: a step of preparing a semiconductor substrate having a first face and a second face, wherein a first insulating film, a polysilicon film, and a second insulating film are formed on the first face in an order of the first insulating film, the polysilicon film, and the second insulating film from the first face, and a polysilicon film and a second insulating film are formed on the second face in an order of the polysilicon film and the second insulating film from the second face; an isolation forming step of forming isolation, the isolation forming step including a process of etching the second insulating film on a side of the first face using a mask including an opening, wherein the isolation is defined by the opening and is formed in the first face of the semiconductor substrate; a second insulating film removing step of removing the second insulating films on the side of the first face and a side of the second face after the isolation forming step; and a polysilicon film removing step of removing the polysilicon film on the side of the first face.

Further features of the present invention will become apparent from the following description of exemplary embodiments with reference to the attached drawings.

DESCRIPTION OF THE EMBODIMENTS

Figure 1A:
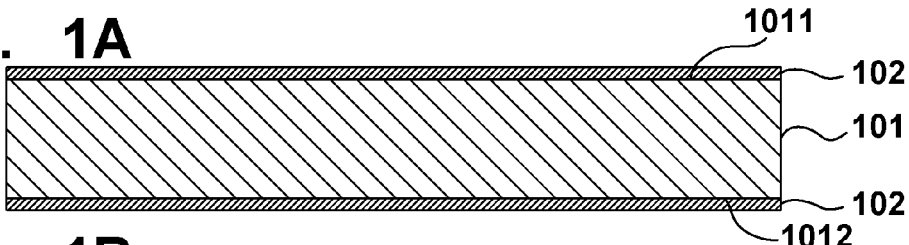
FIGS. 1A to 1F are sectional views showing steps in a method for manufacturing a semiconductor device according to the first embodiment.

Before a description of embodiments according to the present invention, a method for forming a gettering film on the back face of a substrate by the inline process using the STI (Shallow Trench Isolation) method upon applying the technique disclosed in Japanese Patent Laid-Open No. 7-7008 will be described as a Comparative Example with reference to FIGS. 3A to 3F and 4G to 4K. First, in a step shown in FIG. 3A, silicon oxide films 102 are formed on a first face (front face) 1011 and second face (back face) 1012 of a silicon substrate 101 by, for example, the thermal oxidation method. Next, in a step shown in FIG. 3B, the silicon oxide film 102 on the second face 1012, of the first face 1011 and second face 1012 of the silicon substrate 101, is removed by etching. In a step shown in FIG. 3C, polysilicon films 103 are formed on the silicon oxide film 102 on the side of the first face 1011, and the second face 1012 of the silicon substrate 101 by, for example, the thermal CVD method. The polysilicon film 103 formed on the side of the second face 1012 is directly formed on the second face 1012 of the silicon substrate 101, and serves as a gettering film in a subsequent step.

Figure 3A:
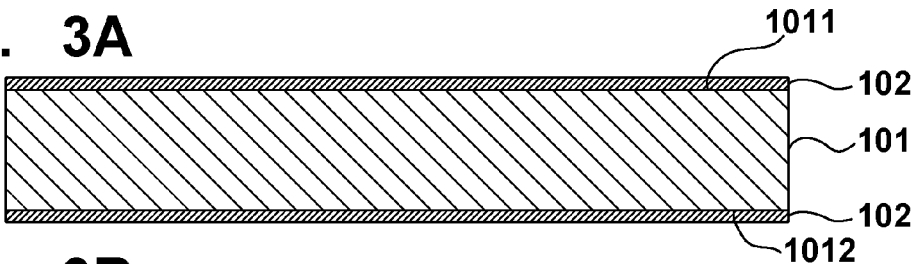
FIGS. 3A to 3F are sectional views showing steps in a method for manufacturing a semiconductor device according to a Comparative Example.
Figure 3B:
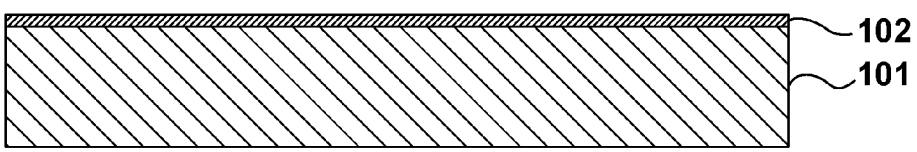
Figure 3C:
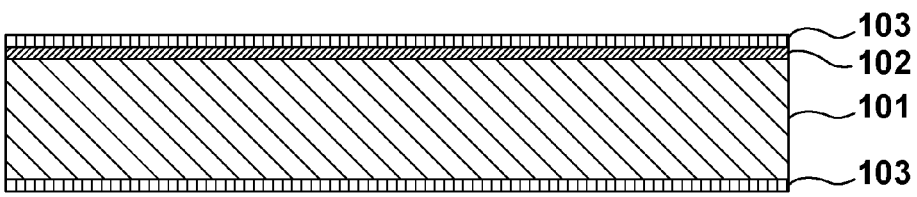
Figure 3D:
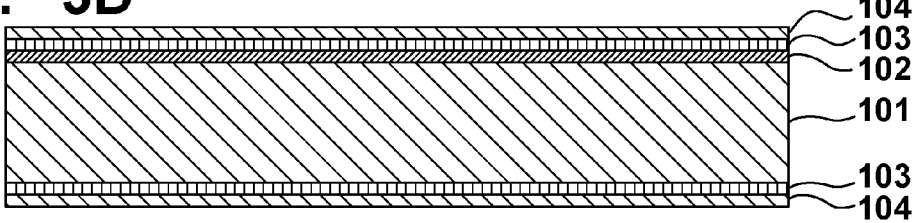
Figure 3E:
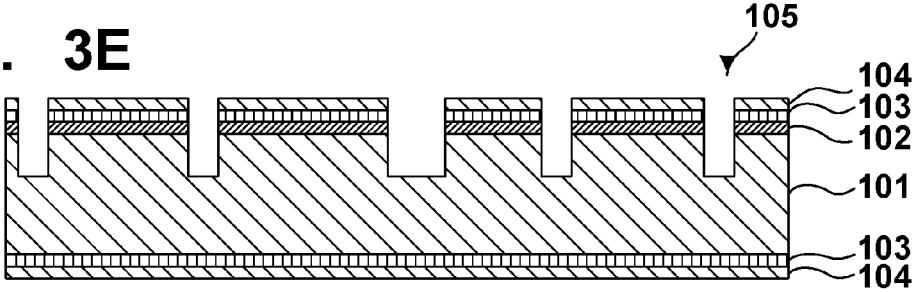
Figure 3F:
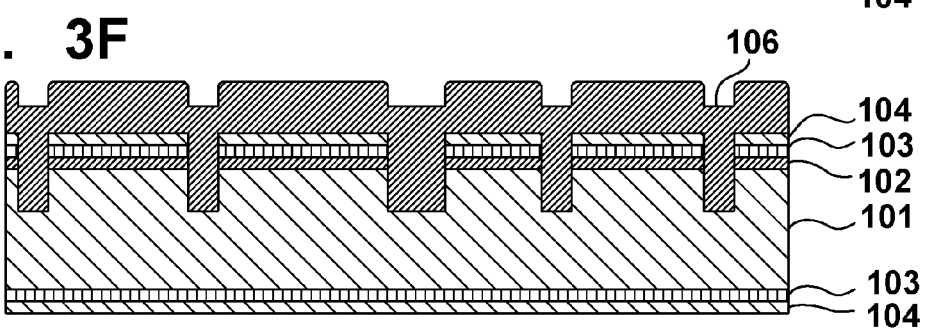
Figure 4G:
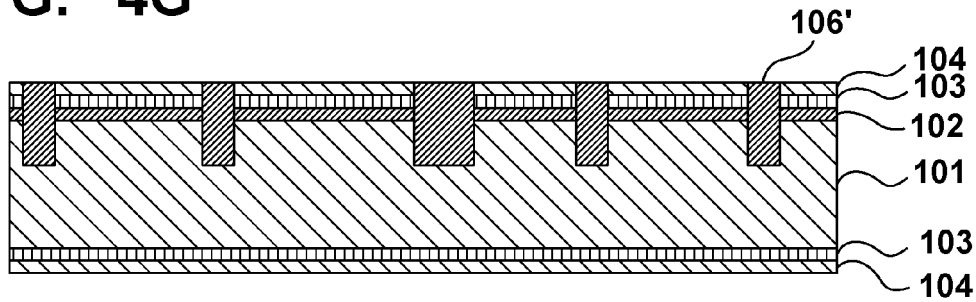
FIGS. 4G to 4K are sectional views showing steps in the method for manufacturing a semiconductor device according to the Comparative Example.

In a step shown in FIG. 3D, silicon nitride films 104 are formed on the polysilicon films 103 on the sides of the first face 1011 and second face 1012. In a step shown in FIG. 3E, trenches 105 are formed in the silicon substrate 101 by photolithography and dry etching. In a step shown in FIG. 3F, silicon oxide (insulator) 106 is formed so that the trenches 105 are sufficiently filled with the silicon oxide 106 by, for example, the HDP (High Density Plasma) method. In a step shown in FIG. 4G, isolation 106' is formed by polishing the silicon oxide 106 by the CMP (Chemical Mechanical Polish) method until the silicon nitride film 104 is exposed.

Figure 4H:
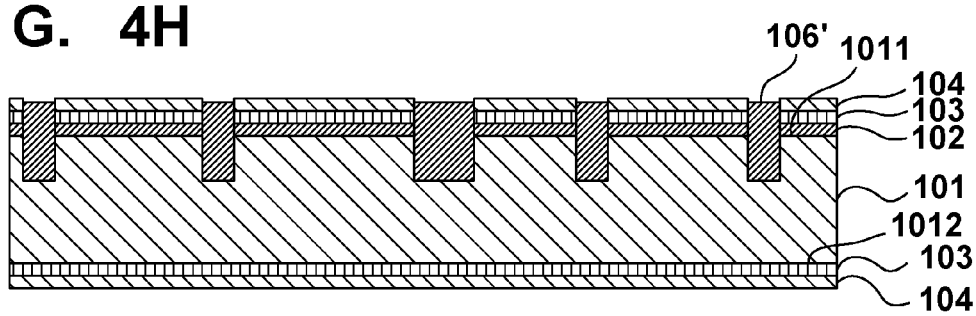
Figure 4I:
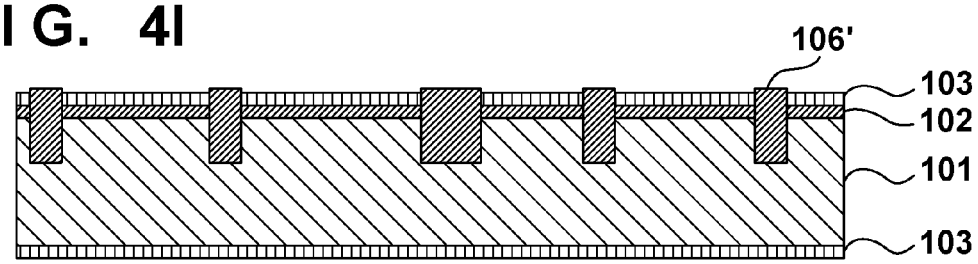
Figure 4J:
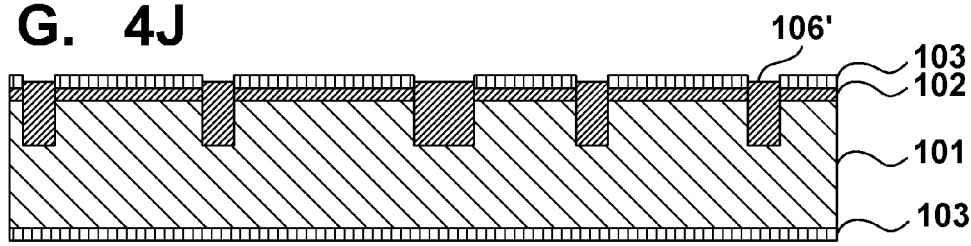
Figure 4K:
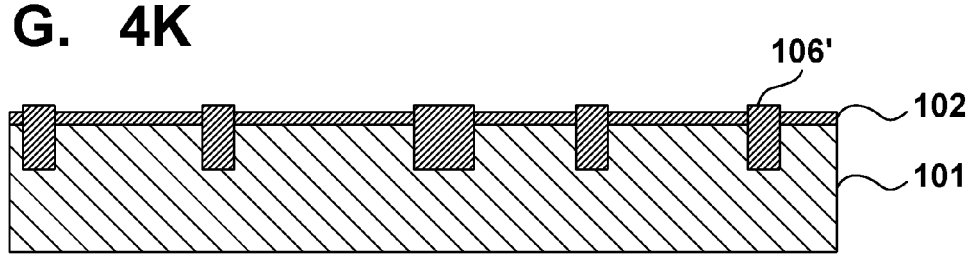

In a step shown in FIG. 4H, to remove a thin oxide film on the surface of the silicon nitride film 104, wet etching is performed using a chemical solution such as an HF (hydrofluoric) solution. With this step, the surface of the isolation 106' which fills the trenches 105 is slightly etched. In a step shown in FIG. 4I, the silicon nitride films 104 on the sides of the first face 1011 and second face 1012 are removed by wet etching using thermal phosphoric acid. In a step shown in FIG. 4J, to remove a thin oxide film on the surface of the polysilicon film 103 on the side of the first face 1011, wet etching is performed using a chemical solution such as an HF solution. With this step, the surface of the isolation 106' which fills the trenches 105 is slightly etched. In a step shown in FIG. 4K, the polysilicon films 103 are removed by wet etching using, for example, an alkali solution. In this step, the polysilicon films 103 on the sides of both the first face 1011 and second face 1012 are removed.

As described above, in the Comparative Example shown in FIGS. 3A to 3F and 4G to 4K, a sufficient gettering effect cannot be obtained because the polysilicon film 103 formed on the side of the second face 1012 as a gettering film is removed in the step shown in FIG. 4K.

Note that such a problem is not limited to the STI process, and may be encountered in the polybuffer LOCOS method. In the polybuffer LOCOS method, a silicon oxide film, a polysilicon film, and a silicon nitride film are sequentially formed on a silicon substrate. Then, an opening is formed in the silicon nitride film to oxidize the polysilicon film and the surface of the silicon substrate through the opening, thereby forming an isolation oxide film. Japanese Patent Laid-Open No. 3-187224, for example, describes details of the polybuffer LOCOS method.

The first embodiment of a method for manufacturing a semiconductor device according to the present invention will be described with reference to FIGS. 1A to 1F and 2G to 2L. First, in a step (first insulating film forming step) shown in FIG. 1A, silicon oxide films (first insulating films) 102 are formed on a first face 1011 and second face 1012 of a silicon substrate (semiconductor substrate) 101. The silicon oxide films 102 can be formed at a temperature that falls within the range of 800° C. to 1,000° C. in an oxidation atmosphere using an oxidation furnace. The silicon oxide films 102 can be formed to have a thickness that falls within the range of, for example, 100 Å (angstrom) to 500 Å.

Figure 1B:
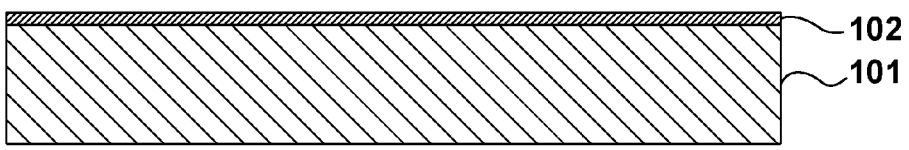

In a step (first insulating film removing step) shown in FIG. 1B, the silicon oxide film 102 on the side of the second face 1012 of the silicon substrate 101 is removed to expose the second face 1012 of the silicon substrate 101. Note that the silicon oxide film 102 only on the side of the second face 1012 can be removed by wet-etching only the side of the second face 1012, of the first face 1011 and second face 1012. More specifically, the silicon oxide film 102 only on the side of the second face 1012 can be removed by processing only the side of the second face 1012 by an HF solution (dilution ratio: about 100:1) at room temperature using, for example, a sheet-fed cleaning device.

Figure 1C:
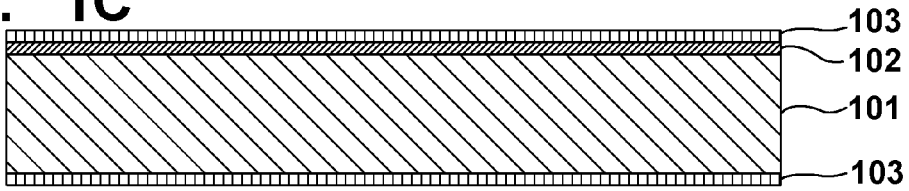

In a step (polysilicon film forming step) shown in FIG. 1C, polysilicon films 103 are formed on the silicon oxide film 102 on the side of the first face 1011 of the silicon substrate 101, and the second face 1012 of the silicon substrate 101. Note that the polysilicon film 103 is formed to be in contact with the second face 1012. The polysilicon films 103 can be formed at a pressure that falls within the range of 10 Pa to 150 Pa and a temperature that falls within the range of 530° C. to 650° C. in an $SiH_4$ gas atmosphere using, for example, a low-pressure thermal chemical vapor deposition device. The polysilicon films 103 can be formed to have a thickness that falls within the range of, for example 200 Å to 1,000 Å.

Figure 1D:
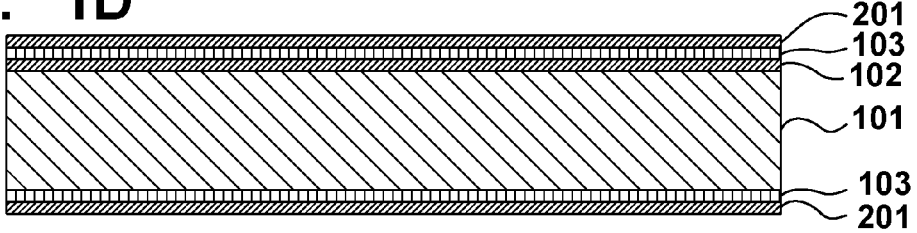

In a step (passivation film forming step) shown in FIG. 1D, silicon oxide films (passivation films) 201 are formed on the polysilicon films 103 on the sides of the first face 1011 and second face 1012. The silicon oxide films 201 can be formed at a temperature that falls within the range of 800° C. to 1,000° C. in an oxidation atmosphere using, for example, an oxidation furnace. The silicon oxide films 201 can be formed to have a thickness that falls within the range of, for example, 50 Å to 200 Å. The silicon oxide films 201 may be formed using, for example, a low-pressure thermal chemical vapor deposition device for forming a silicon oxide film. The silicon oxide films 201 function as passivation films which protect the polysilicon films 103.

Figure 1E:
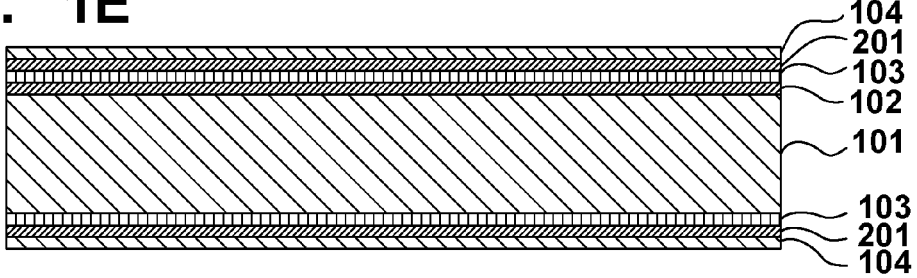

In a step (second insulating film forming step) shown in FIG. 1E, silicon nitride films (second insulating films) 104 are formed on the silicon oxide films 201 formed on the polysilicon films 103 on the sides of the first face 1011 and second face 1012. The silicon nitride films 104 can be formed at a pressure that falls within the range of 10 Pa to 150 Pa and a temperature that falls within the range of 650° C. to 850° C. in a mixed gas atmosphere of $SiH_2CL_2$ and $NH_3$ using, for example, a low-pressure thermal chemical vapor deposition device. The silicon nitride films 104 can be formed to have a thickness that falls within the range of, for example, 1,000 Å to 3,000 Å. The following steps may be executed by preparing the silicon substrate having undergone the above-mentioned series of steps.

Figure 1F:
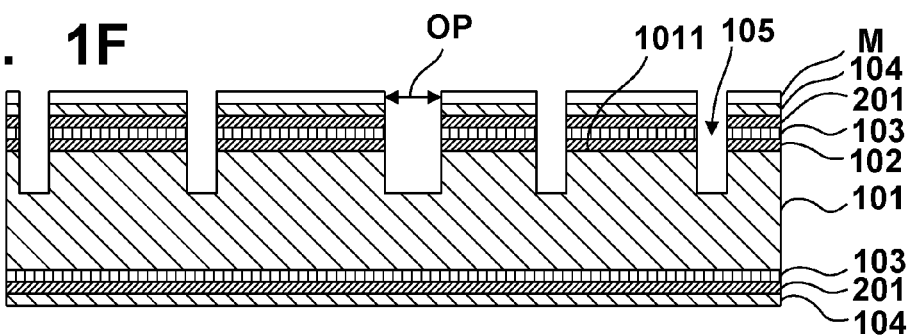
Figure 2G:
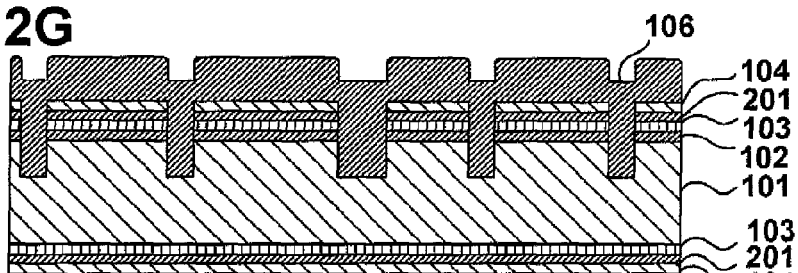
FIGS. 2G to 2L are sectional views showing steps in the method for manufacturing a semiconductor device according to the first embodiment.
Figure 2H:
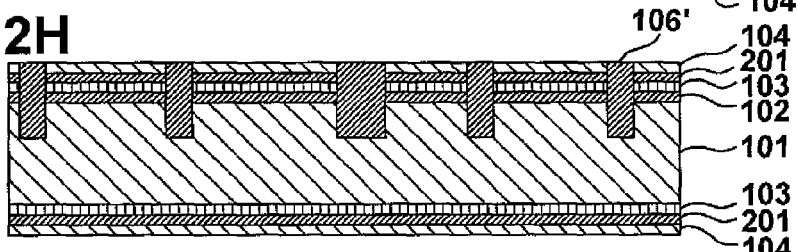

In an isolation forming step shown in FIGS. 1F, 2G, and 2H, isolation 106' is formed in the first face 1011 of the silicon substrate 101. The isolation forming step includes a process of etching the silicon nitride film 104 on the side of the first face 1011 using a mask M such as a resist pattern having an opening OP. In this step, the isolation 106' is formed in the first face 1011 of the silicon substrate 101, wherein the isolation 106' is defined by the opening OP. More specifically, in a step shown in FIG. 1F, a mask M such as a resist pattern is formed on the silicon nitride film 104. Then, the silicon nitride film 104, silicon oxide film 201, polysilicon film 103, and silicon oxide film 102 on the side of the first face 1011 are etched through an opening OP formed in the mask M, and the silicon substrate 101 is further etched. Thus, trenches 105 are formed in the first face 1011 of the silicon substrate 101. This etching can be done by, for example, the dry etching method. More specifically, this etching can be done by the RIE (Reactive Ion Etching) method using a fluorocarbon gas such as $CF_4$ gas. The depth of the trenches 105 can be determined to fall within the range of, for example, 1,000 Å to 3,000 Å. In a step shown in FIG. 2G, silicon oxide (insulator) 106 is formed inside the trenches 105 and on the surface of the substrate (that is, on the surface of the silicon oxide film 201). The silicon oxide 106 can be formed using an HDP (High Density Plasma) chemical vapor deposition device at a temperature that falls within the range of 300° C. to 500° C. using, for example, a mixed gas of Ar, $O_2$, and $SiH_4$ as a processing gas. The silicon oxide 106 can be formed to have a thickness that falls within the range of, for example, 3,000 Å to 7,000 Å. In a step shown in FIG. 2H, the silicon oxide 106 is removed and polished by etching and the CMP (Chemical Mechanical Polish) method. In this step, the surface of the silicon nitride film 104 is exposed while leaving the silicon oxide inside the trenches 105 intact as the isolation 106'. This CMP method can be performed using a silica-based slurry or ceria-based slurry and an abrasive cloth which rotates at a speed that falls within the range of 50 rpm to 100 rpm, and is pressed at a pressure that falls within the range of 100 hPa to 300 hPa. The isolation forming step shown in FIGS. 1F, 2G, and 2H is called the STI (Shallow Trench Isolation) method.

In place of the isolation forming step shown in FIGS. 1F, 2G, and 2H, another isolation forming step may be performed. The other isolation forming step includes a process of etching the silicon nitride film 104 on the side of the first face 1011 using a mask having an opening OP. In this step, the isolation 106' is formed in the first face 1011 of the silicon substrate 101, wherein the isolation 106' is defined by the opening OP. In this respect, the other isolation forming step is common to the isolation forming step shown in FIGS. 1F, 2G, and 2H. However, in the other isolation forming step, the silicon nitride film 104 is etched to form an opening portion (an oxidation opening portion) to oxidize the polysilicon film 103 on the side of the first face 1011 and partly oxidize the first face 1011 of the silicon substrate 101, through the opening portion. In this respect, the other isolation forming step is different from the isolation forming step shown in FIGS. 1F, 2G, and 2H. The other isolation forming step is called the polybuffer LOCOS method.

Figure 2I:
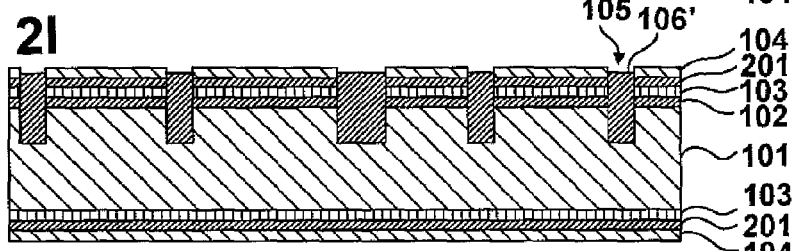

In a step shown in FIG. 2I, the thickness of the silicon oxide inside the trenches 105, that is, the isolation 106' is adjusted. This process can be performed by, for example, the wet etching method. More specifically, this process can be performed by an HF solution (dilution ratio: about 100:1) at room temperature using, for example, a batch-type wet station.

Figure 2J:
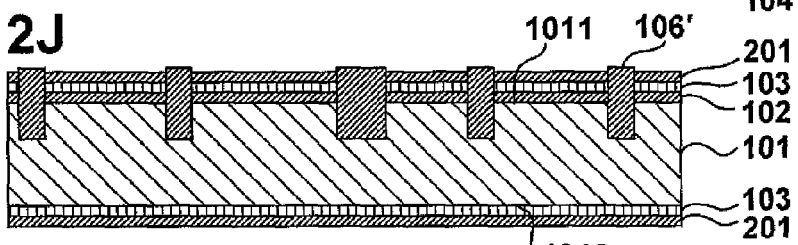

In a step (second insulting film removing step) shown in FIG. 2J, the silicon nitride films (second insulating films) 104 on the sides of the first face 1011 and second face 1012 are removed. The silicon oxide films 201 on the sides of the first face 1011 and second face 1012 are exposed. The silicon nitride films 104 can be removed by, for example, the wet etching method. More specifically, the silicon nitride films 104 can be removed by a phosphoric acid solution, adjusted at a temperature that falls within the range of 150° C. to 170° C., using, for example, a batch-type wet station.

Figure 2K:
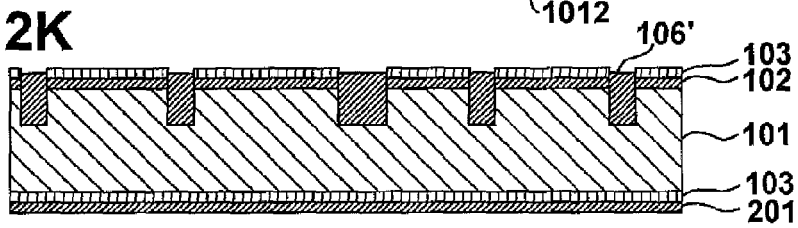

In a step shown in FIG. 2K, the silicon oxide film 201 on the side of the first face 1011 of the silicon substrate 101 is removed to expose the polysilicon film 103 on the side of the first face 1011. The silicon oxide film 201 can be removed by, for example, the wet etching method. More specifically, the silicon oxide film 201 can be removed by an HF solution (dilution ratio: about 100:1) at room temperature using, for example, a sheet-fed cleaning device. After this step, the polysilicon film 103 is exposed on the side of the first face 1011, whereas the silicon oxide film 201 is exposed on the side of the second face 1012. Note that the step shown in FIG. 2K is also intended to adjust the thickness of the isolation 106', like the step shown in FIG. 2I.

Figure 2L:
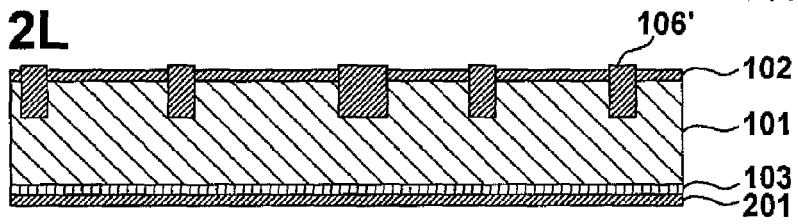

In a step (polysilicon film removing step) shown in FIG. 2L, the polysilicon film 103 on the side of the first face 1011, of the first face 1011 and second face 1012, is removed. At this time, the silicon oxide film 201 on the side of the second face 1012 functions as a passivation film which protects the polysilicon film 103 on the side of the second face 1012. The polysilicon film 103 can be removed by, for example, the wet etching method using an alkali chemical solution. More specifically, the polysilicon film 103 can be removed by a mixed solution of ammonia/hydrogen peroxide/pure water as a processing solution at a temperature that falls within the range of 50° C. to 100° C. using, for example, a batch-type wet station. Under such conditions, a high etching selectivity can be obtained between the polysilicon film 103 and the silicon oxide film 201.

With the above-mentioned steps, the isolation forming process is completed. Then, by forming elements such as transistors in accordance with an arbitrary method, a semiconductor device can be completed.

In the Comparative Example, the polysilicon film 103 formed on the side of the second face 1012 as a gettering film is removed, thus making it impossible to obtain a sufficient gettering effect. In contrast to this, according to the first embodiment, the polysilicon film 103 can remain on the second face 1012 of the substrate 101 without adding a complicated step. This makes it possible to improve the gettering effect, thus suppressing degradation in property of the semiconductor device due to contamination by a metal impurity such as a heavy metal impurity.

Figure 5E:
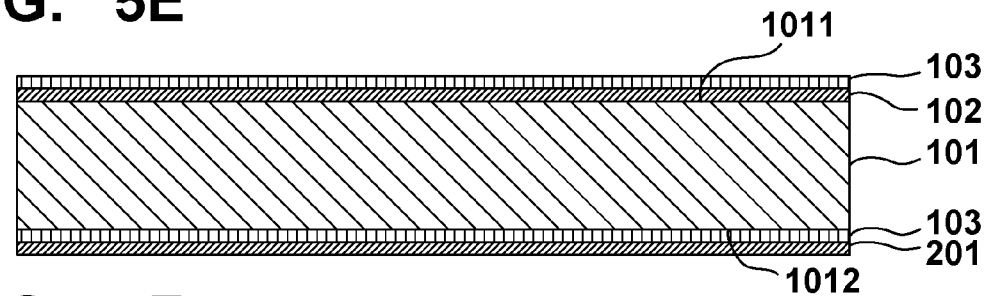
FIGS. 5E to 5I are sectional views showing steps in a method for manufacturing a semiconductor device according to the second embodiment.

The second embodiment of a method for manufacturing a semiconductor device according to the present invention will be described below with reference to FIGS. 1A to 1F, 5E to 5I, and 6J to 6M. In the second embodiment, steps shown in FIGS. 1A to 1D are the same as those in the first embodiment, and a step shown in FIG. 5E is performed after a step shown in FIG. 1D. Steps shown in FIGS. 1A to 1D will not be described herein.

In the step shown in FIG. 5E performed after the step shown in FIG. 1D, a silicon oxide film (passivation film) 201 on the side of a first face 1011, of the first face 1011 and a second face 1012, is removed. Thus, a polysilicon film 103 on the side of the first face 1011 is exposed. The silicon oxide film 201 on the side of the first face 1011 can be removed by, for example, the wet etching method. More specifically, the silicon oxide film 201 on the side of the first face 1011 can be removed by an HF solution (dilution ratio: about 100:1) at room temperature using, for example, a sheet-fed cleaning device. With the step shown in FIG. 5E, a substrate having the polysilicon film 103 exposed on the side of the first face 1011, and the silicon oxide film 201 exposed on the side of the second face 1012 can be obtained.

Figure 5F:
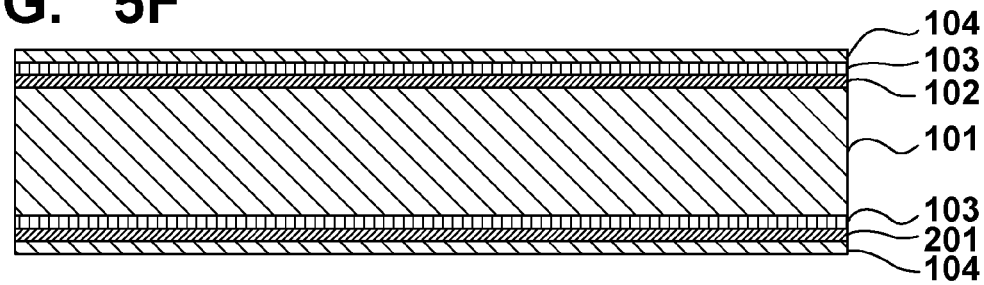

In a step (second insulating film forming step) shown in FIG. 5F, silicon nitride films (second insulating films) 104 are formed on the polysilicon films 103 on the sides of the first face 1011 and second face 1012. Note that the silicon nitride film 104 is directly formed on the polysilicon film 103 on the side of the first face 1011, and the silicon nitride film 104 is formed on the silicon oxide film 201 formed on the polysilicon film 103 on the side of the second face 1012. The conditions under which the silicon nitride films 104 are formed can be the same as those in the step shown in FIG. 1E.

Figure 5G:
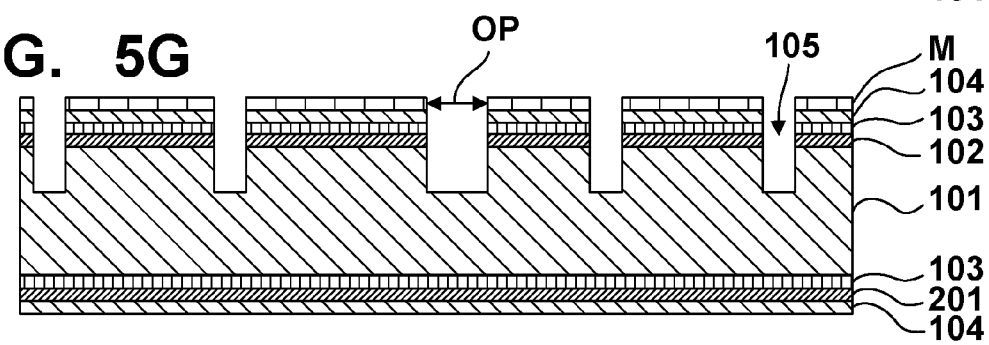
Figure 5H:
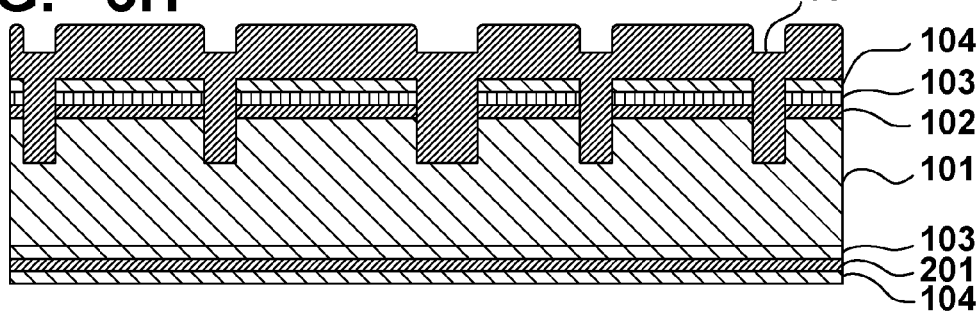
Figure 5I:
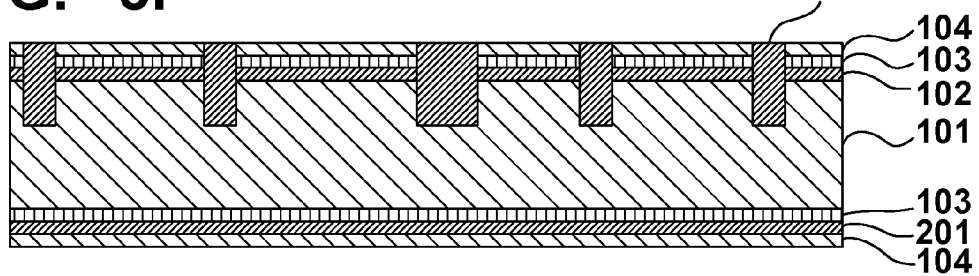

In an isolation forming step shown in FIGS. 5G to 5I, isolation 106' is formed on the first face 1011 of a silicon substrate 101. This step includes a process of etching the silicon nitride film 104 on the side of the first face 1011 using a mask M such as a resist pattern having an opening OP. In this step, the isolation 106' is formed in the first face 1011 of the silicon substrate 101, wherein the isolation 106' is defined by the opening OP. More specifically, in a step shown in FIG. 5G, a mask M such as a resist pattern is formed on the silicon nitride film 104. Then, the silicon nitride film 104, silicon oxide film 201, polysilicon film 103, and silicon oxide film 102 on the side of the first face 1011 are etched through an opening OP formed in the mask M, and the silicon substrate 101 is further etched. Thus, trenches 105 are formed in the first face 1011 of the silicon substrate 101. The conditions under which the trenches 105 are formed can be the same as those in the step shown in FIG. 1F. Steps shown in FIGS. 5H and 5I are the same as those shown in FIGS. 2G and 2H, respectively.

Figure 6J:
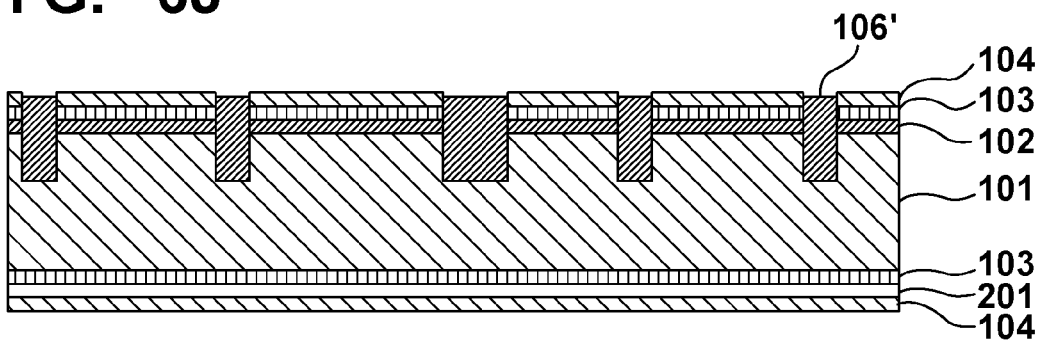
FIGS. 6J to 6M are sectional views showing steps in the method for manufacturing a semiconductor device according to the second embodiment.
Figure 6K:
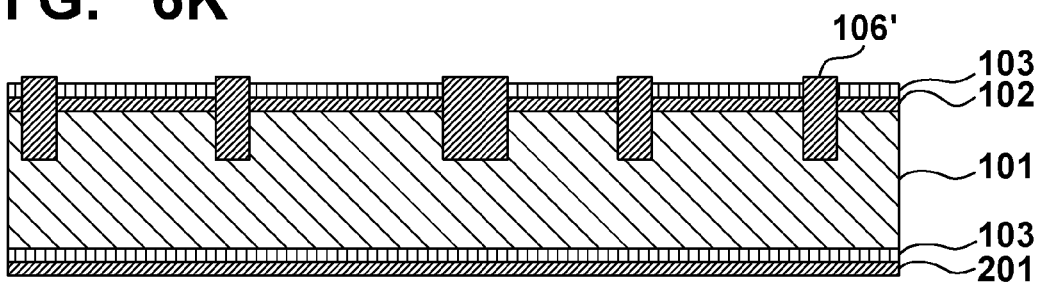
Figure 6L:
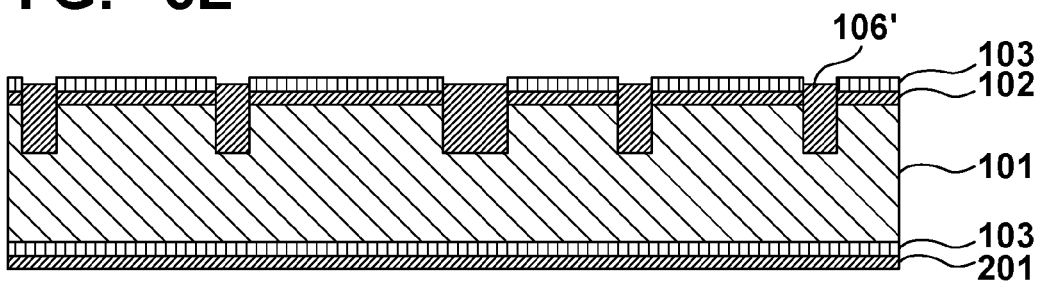

Steps shown in FIGS. 6J and 6K performed next are the same as those shown in FIGS. 2I and 2J, respectively. In a step shown in FIG. 6L, the thickness of the silicon oxide inside the trenches 105, that is, the isolation 106' is adjusted. This process can be performed by, for example, the wet etching method. More specifically, this process can be performed only on the side of the first face 1011 by an HF solution (dilution ratio: about 100:1) at room temperature using, for example, a batch-type wet station.

Figure 6M:
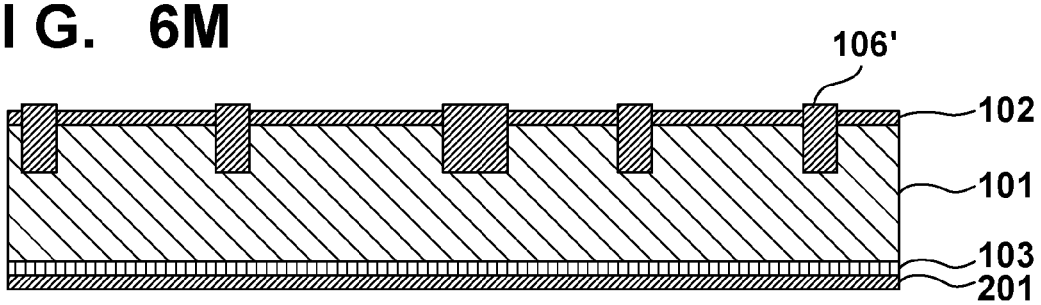

A step (polysilicon film removing step) shown in FIG. 6M performed next is the same as that shown in FIG. 2I. In this step, the polysilicon film 103 on the side of the first face 1011, of the first face 1011 and second face 1012, is removed. At this time, the silicon oxide film 201 on the side of the second face 1012 functions as a passivation film which protects the polysilicon film 103 on the side of the second face 1012.

With the above-mentioned steps, the isolation forming process is completed. Then, by forming elements such as transistors in accordance with an arbitrary method, a semiconductor device can be completed.

As described above, according to the second embodiment, the polysilicon film 103 can remain on the second face 1012 of the substrate 101 without adding a complicated step. This makes it possible to improve the gettering effect, thus suppressing degradation in property of the semiconductor device due to contamination by a metal impurity such as a heavy metal impurity.

Figure 7A:
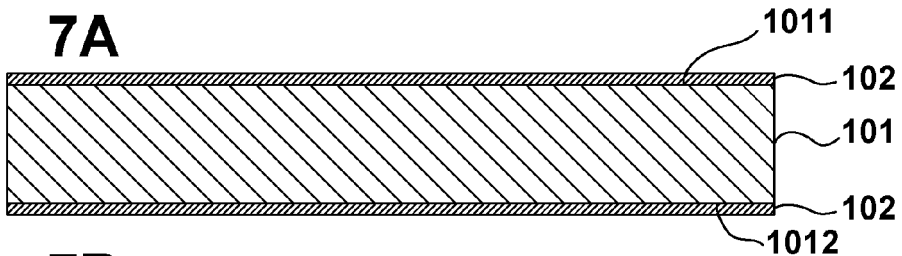
FIGS. 7A to 7F are sectional views showing steps in a method for manufacturing a semiconductor device according to the third embodiment.
Figure 7B:
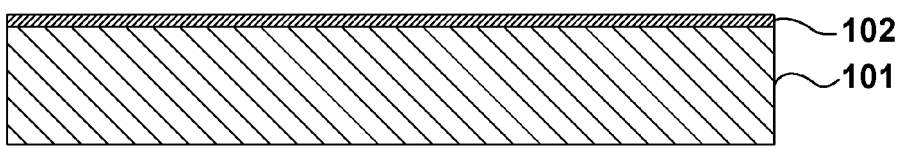

The third embodiment of a method for manufacturing a semiconductor device according to the present invention will be described below with reference to FIGS. 7A to 7F and 8G to 8L. Steps shown in FIGS. 7A to 7C are the same as those shown in FIGS. 1A to 1C, respectively.

Figure 7C:
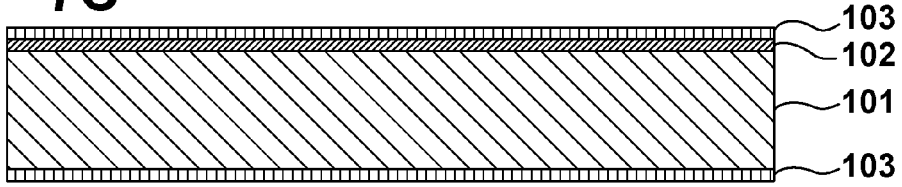
Figure 7D:
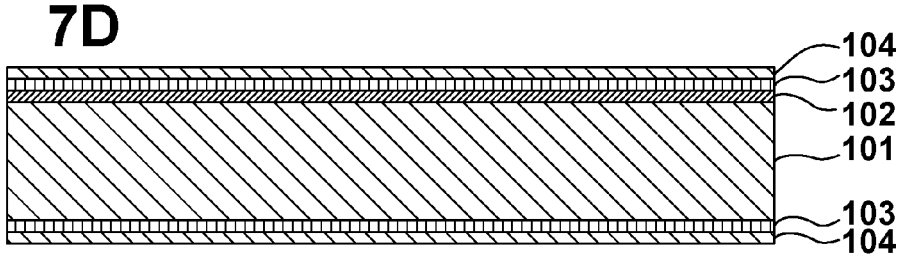
Figure 7E:
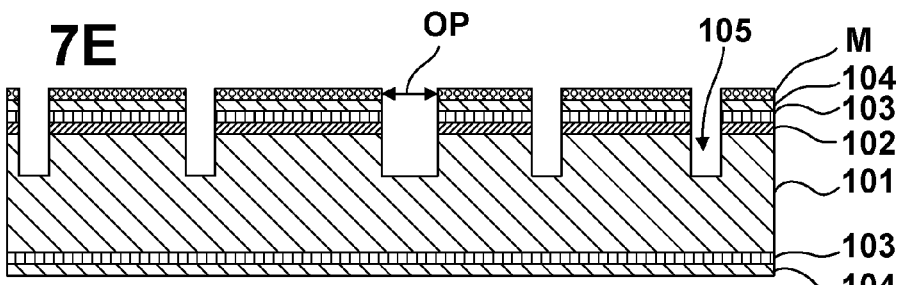
Figure 7F:
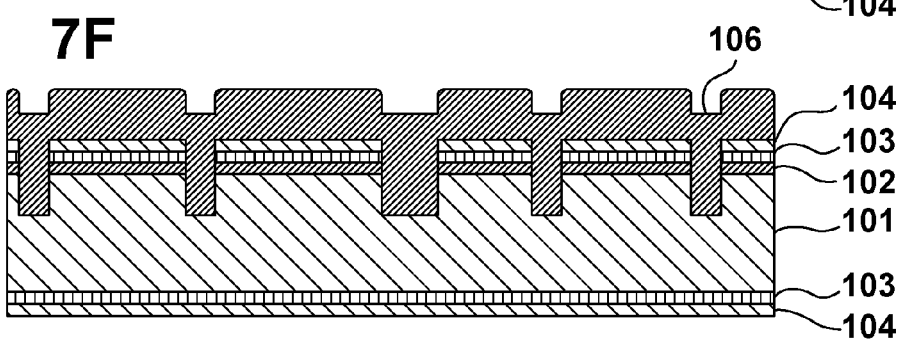

In a step (second insulating film forming step) shown in FIG. 7D performed next to the step shown in FIG. 7C, silicon nitride films (second insulating films) 104 are formed on polysilicon films 103 on the sides of a first face 1011 and second face 1012. Note that in the third embodiment, the silicon nitride films 104 are directly formed on the polysilicon films 103 on the sides of the first face 1011 and second face 1012. The conditions under which the silicon nitride films 104 are formed can be the same as those in the step shown in FIG. 1E.

Steps shown in FIGS. 7E, 7F, 8G, and 8H performed next are the same as those shown in FIGS. 1F, 2G, 2H, and 2I, respectively. In a step shown in FIG. 8I performed next, the silicon nitride films 104 formed on the sides of the first face 1011 and second face 1012 of a silicon substrate 101 are removed to expose the polysilicon films 103. The conditions under which the silicon nitride films 104 are removed can be the same as those in the step shown in FIG. 2J.

Figure 8G:
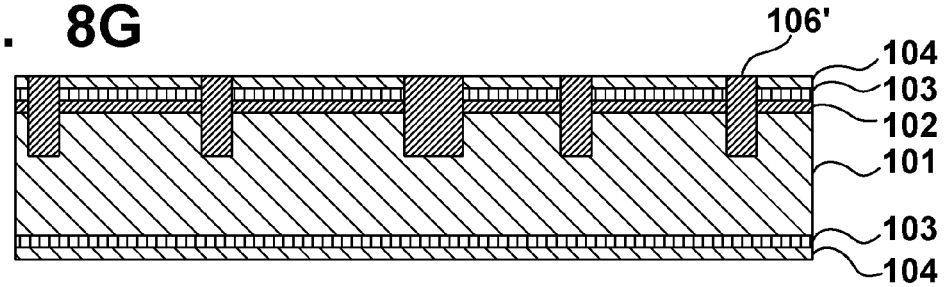
FIGS. 8G to 8L are sectional views showing steps in the method for manufacturing a semiconductor device according to the third embodiment.
Figure 8H:
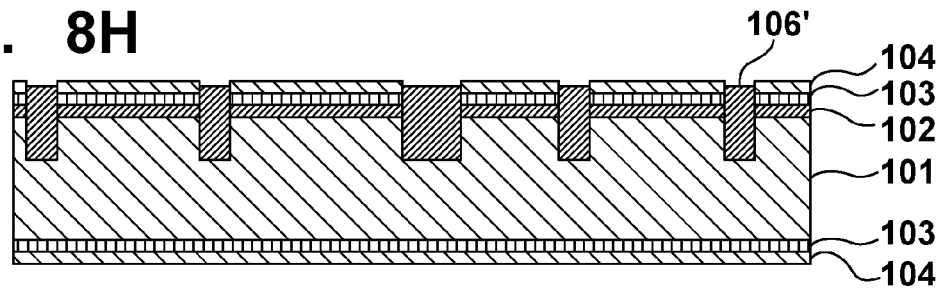
Figure 8I:
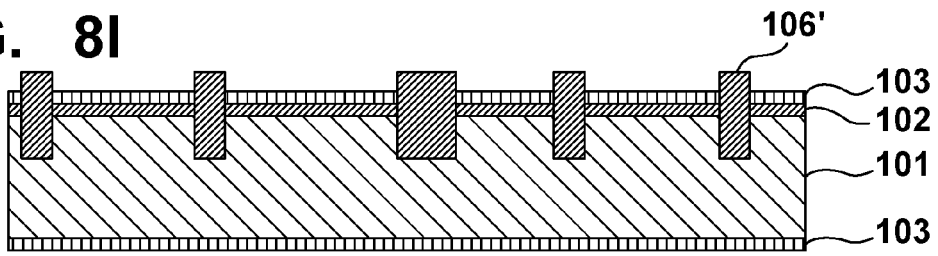
Figure 8J:
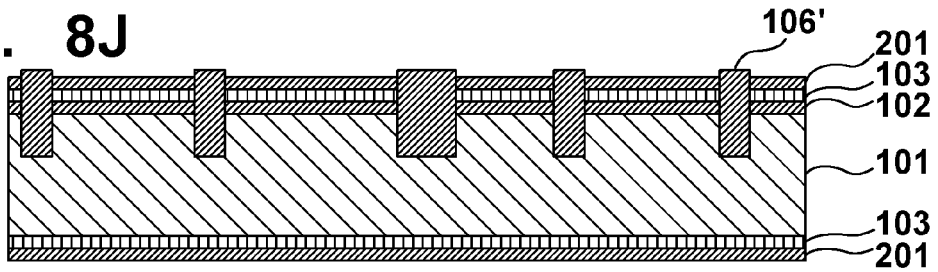
Figure 8K:
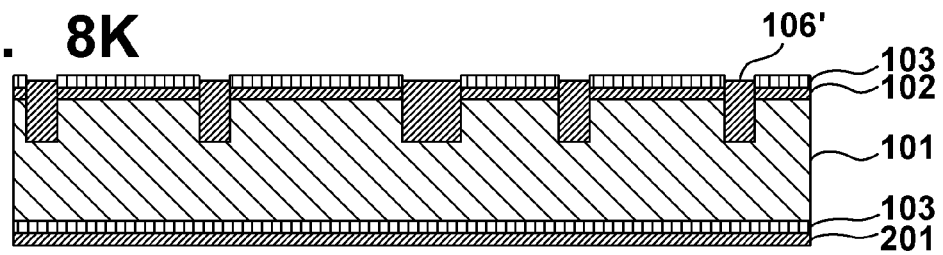
Figure 8L:
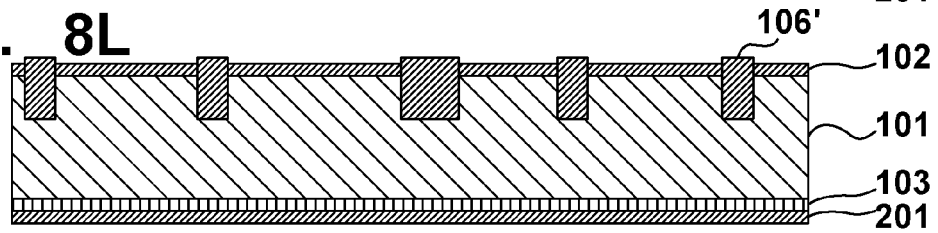

In a step shown in FIG. 8J, silicon oxide films (passivation films) 201 are formed on the polysilicon films 103 on the sides of the first face 1011 and second face 1012 of the silicon substrate 101. The conditions under which the silicon oxide films 201 are formed can be the same as those in step shown in FIG. 1D. In a step shown in FIG. 8K, the silicon oxide film 201 on the side of the first face 1011, of the first face 1011 and second face 1012 of the silicon substrate 101, is removed to expose the polysilicon film 103 only on the side of the first face 1011. The conditions under which the silicon oxide films 201 are removed can be the same as those in the step shown in FIG. 2K.

A step (polysilicon film removing step) shown in FIG. 8I performed next is the same as that shown in FIG. 2I. In this step, the polysilicon film 103 on the side of the first face 1011, of the first face 1011 and second face 1012, is removed. At this time, the silicon oxide film 201 on the side of the second face 1012 functions as a passivation film which protects the polysilicon film 103 on the side of the second face 1012.

With the above-mentioned steps, the isolation forming process is completed. Then, by forming elements such as transistors in accordance with an arbitrary method, a semiconductor device can be completed.

As described above, according to the third embodiment, the polysilicon film 103 can remain on the second face 1012 of the substrate 101 without adding a complicated step. This makes it possible to improve the gettering effect, thus suppressing degradation in property of the semiconductor device due to contamination by a metal impurity such as a heavy metal impurity. Note that the isolation according to the present invention is limited neither to the STI method nor the polybuffer LOCOS method, and is also applicable to the MESA method and the EDI method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-278395, filed Dec. 14, 2010, which is hereby incorporated by reference herein in its entirety.

What is claimed is:
1. A method for manufacturing a semiconductor device, the method comprising:
    a step of preparing a semiconductor substrate having a first face and a second face, wherein a first insulating film, a polysilicon film, and a second insulating film are formed on the first face in an order of the first insulating film, the polysilicon film, and the second insulating film from the first face, and a polysilicon film and a second insulating film are formed on the second face in an order of the polysilicon film and the second insulating film from the second face;
    an isolation forming step of forming isolation, the isolation forming step including a process of etching the second insulating film on a side of the first face using a mask including an opening, wherein the isolation is defined by the opening and is formed in the first face of the semiconductor substrate;

a second insulating film removing step of removing the second insulating films on the side of the first face and a side of the second face after the isolation forming step; and a polysilicon film removing step of removing the polysilicon film on the side of the first face.

2. A method for manufacturing a semiconductor device, the method comprising:

a first insulating film forming step of forming first insulating films on a first face and a second face of a semiconductor substrate;

a first insulating film removing step of removing the first insulating film on a side of the second face;

a polysilicon film forming step of forming polysilicon films on the first insulating film on a side of the first face, and the second face of the semiconductor substrate;

a second insulating film forming step of forming second insulating films on the polysilicon films on the side of the first face and the side of the second face;

an isolation forming step of forming isolation, the isolation forming step including a process of etching the second insulating film on the side of the first face using a mask including an opening, wherein the isolation is defined by the opening and is formed in the first face of the semiconductor substrate;

a second insulating film removing step of removing the second insulating films on the side of the first face and the side of the second face after the isolation forming step;

a polysilicon film removing step of removing the polysilicon film on the side of the first face, of the first face and the second face; and a passivation film forming step of forming a passivation film which protects the polysilicon film on the side of the second face so that the polysilicon film on the side of the second face is not removed in the polysilicon film removing step, after the polysilicon film forming step and before the polysilicon film removing step.

3. The method according to claim 2, wherein the isolation forming step includes steps of:

forming a trench in the first face of the semiconductor substrate using the mask; and filling the trench with an insulator.

4. The method according to claim 2, wherein the isolation forming step includes a step of forming an opening portion in the second insulating film using the mask to oxidize the polysilicon film on the side of the first face and partly oxidize the first face of the semiconductor substrate, through the opening portion.

5. The method according to claim 2, wherein the passivation film forming step is performed after the polysilicon film forming step and before the second insulating film forming step.

6. The method according to claim 2, wherein the passivation film forming step is performed after the second insulating film forming step and before the polysilicon film removing step.

7. The method according to claim 2, wherein the first insulating film includes a silicon oxide film, and the second insulating film includes a silicon nitride film.

* * * * *